United States Patent
Bae

(10) Patent No.: US 6,410,211 B2
(45) Date of Patent: *Jun. 25, 2002

(54) METHOD FOR MANUFACTURING A LIQUID CRYSTAL DISPLAY DEVICE

(75) Inventor: Sung Joon Bae, Kyoungki-do (KR)

(73) Assignee: LG Electronics, Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,200

(22) Filed: Nov. 25, 1998

(30) Foreign Application Priority Data

Nov. 27, 1998 (KR) ............................... 97-63559

(51) Int. Cl.⁷ .................................. G03F 7/00
(52) U.S. Cl. ...................... 430/318; 430/313; 430/317; 430/319; 430/396
(58) Field of Search ................... 430/318, 312, 430/314, 319, 316, 323, 396; 438/30, 947

(56) References Cited

U.S. PATENT DOCUMENTS 4,231,811 A * 11/1980 Somekh et al. ............. 438/301
5,985,766 A * 11/1999 Wu et al. .................... 438/700
6,043,000 A * 3/2000 Park et al. ................... 430/318

FOREIGN PATENT DOCUMENTS

| JP | 1100518 | 4/1989 |
| JP | 5003164 | 8/1993 |
| JP | 5343535 | 12/1993 |
| JP | 7-028074 | * 1/1995 |

* cited by examiner

Primary Examiner—John A. McPherson
(74) Attorney, Agent, or Firm—Birch Stewart Kolasch & Birch, LLP

(57) ABSTRACT

A method for manufacturing an LCD including at least two stacked thin layers in which the upper thin film smoothly and completely covers the lower thin film includes the steps of coating a photo-resist on a patterned layer, patterning the photo-resist by exposing and developing the photo-resist with a mask which has lines and spaces in which a distance between the lines is smaller than a resolution of an exposure system used and etching the metal layer using the patterned photo-resist as a mask. The resulting photo-resist pattern has a comb shape.

20 Claims, 7 Drawing Sheets

METHOD FOR MANUFACTURING A LIQUID CRYSTAL DISPLAY DEVICE

BACKGROUND OF THE INVENTION

1. Field of the Invention

The present invention relates to a method of manufacturing a liquid crystal display device (LCD) and more specifically, to a method for manufacturing an LCD including at least two stacked thin layers in which the upper thin film smoothly and completely covers the lower thin film and in which a photo-resist layer is formed in a single masking step to have a thick portion and a thin portion.

2. Description of the Background Art

A thin film type liquid crystal display device includes an upper panel, a lower panel and a liquid crystal material inserted therebetween. At the outer side of the two joined panels, polarizing plates are attached. The upper panel includes an inner side having a color filter and a common electrode and an outer side having a polarizing plate. As seen in FIGS. 1, 2, 3a and 3b, the lower panel includes an outer side having another polarizing plate and an inner side having a plurality of gate bus lines 10 and a gate pad 10a, a plurality of data bus lines 20 and data pad 20a, a TFT switching element C and a pixel electrode 30.

The structure of the lower panel is explained hereafter in detail, referring to FIG. 2 which shows a plan view of the conventional LCD and FIG. 3a which shows a cross-sectional view of the conventional LCD along the line A—A of FIG. 2.

A plurality of the gate bus lines 10 perpendicularly cross a plurality of the data bus lines 20. The TFT switching element C, which includes a gate electrode 11 which is derived from the gate bus line 10, a source electrode 21 which is derived from the data bus line 20 and a drain electrode 22 which faces the source electrode 21, is disposed at the intersection portion of the gate bus line 10 and the data bus line 20. A pixel electrode 30 connected to the drain electrode 22 and an output electrode of the TFT C are formed in the area surrounded by the gate line 10 and the source line 20.

The process of manufacturing the lower panel of the conventional LCD is explained hereinafter.

A first metal layer is formed by depositing aluminum or aluminum alloy on a transparent substrate 1. A plurality of gate bus lines 10, a gate pad 10a and a gate electrode 11 derived from the gate bus line 10 are formed by etching the first metal layer.

A gate insulating layer 12 which has a good adhesive property with an amorphous silicon and a high insulating property, such as $SiN_x$ or $SiO_x$, is formed on the substrate 1 which includes the gate bus line 10, the gate electrode 11 and the gate pad 10a.

On the gate insulating layer 12, an amorphous silicon and an n⁺ type impurity doped amorphous silicon are sequentially deposited and patterned to form an intrinsic semiconductor layer 15 and a doped semiconductor layer 16 (or an ohmic contact layer).

A second metal layer is formed on the entire surface of the substrate, and may be formed of aluminum or aluminum alloy. The second metal layer is patterned to form a plurality of data bus lines 20 which perpendicularly cross the gate bus lines 10, a data pad 20a which is disposed at the each end of the data bus line 10, a source electrode 21 which is derived from the data bus line 20 and a drain electrode 22 which faces the source electrode 21. As a result, a TFT switching element including the gate electrode 11, the semiconductor layers 15 and 16, the source electrode 21 and the drain electrode 22 is completed.

On the substrate including the gate bus line 10, the data bus line 20, the gate pad 10a, the data pad 20a and the switching element, a passivation layer 23 is formed using $SiN_x$, $SiO_x$ or BCB(benzocyclobutene). A contact hole is formed by removing some portion of the passivation layer 23 which covers the drain electrode 22 to expose some portions of the drain electrode 22.

An ITO(Indium Tin Oxide) layer is deposited on the passivation layer 23 via a sputtering method. The pixel electrode 30 is formed by patterning the ITO layer. The pixel electrode 30 is connected to the drain electrode 22 through the contact hole.

The method of manufacturing the conventional LCD includes many processes for forming thin layers which are stacked on each other, and the thin layers are deposited and patterned via masking processes. The LCD according to this conventional method has a stacked structure as shown in FIG. 3a in which the gate bus line 10 and the data bus line 20, the gate electrode 11 and the data electrode 21, the pixel electrode 30 and the drain electrode 22 cross each other.

In this stacked structure, the cross-sectional shape of the lower layer is a main factor for determining the deposited state of the upper layer. If the cross sectional shape of the lower layer has an inverse tapered shape or a shoulder, the upper layer deposited thereon has discontinued or unstable portions.

For example, as shown in FIG. 3b, the cross-sectional shape, taken along the line B—B of FIG. 2, of the drain electrode 22 determines how the passivation layer 23 and the pixel electrode 30 will be deposited thereon. When the cross-sectional shape of the drain electrode 22 has an inverse tapered shape, the passivation layer 23 has a shoulder 24 or crack formed therein. At these portions having the shoulder 24 or the cracks, the pixel electrode 30 when deposited has a greatly reduced thickness or is even discontinued at this portion. Furthermore, when the pixel electrode is patterned by using an etchant on the cracked passivation layer, the drain electrode can be damaged by the etchant as it spreads or percolates through the cracks.

SUMMARY OF THE INVENTION

To overcome the problems described above, the preferred embodiments of the present invention provide a method of forming stacked thin layers in which intersecting portions of the stacked thin layers have a smoothly tapered cross-sectional shape to prevent formation of cracked or discontinued portions. In addition, preferred embodiments of the present invention provide a method of manufacturing an LCD in which a photo-resist layer having different thicknesses is formed in a single masking step.

According to one preferred embodiment of the present invention, a method of manufacturing a semiconductor device includes the steps of providing a substrate, forming a layer on the substrate, coating a photo-resist on the layer, and exposing and developing the photo-resist using only a single mask such that the photo-resist has a pattern including a thick portion and thin portion. The single mask used in this preferred embodiment preferably includes a plurality of lines and spaces between the lines, wherein a distance between the lines of the mask is less than a resolution of a system used for exposing the photo-resist.

In another preferred embodiment of the present invention, a method of manufacturing a semiconductor device includes the steps of providing a substrate, forming a layer on the substrate, coating a photo-resist on the layer, and performing a single masking step to develop the photo-resist such that the photo-resist has a thick portion and a thin portion. In this preferred embodiment, the single mask step is done using a mask that includes a plurality of lines and spaces between the lines, wherein a distance between the lines of the mask is less than a resolution of a system used for exposing the photo-resist.

BRIEF DESCRIPTION OF THE ATTACHED DRAWINGS

The present invention will become more fully understood from the detailed description of preferred embodiments provided hereinafter and by the accompanying drawings which are by way of illustration and therefore not limitative of the present invention and wherein.

Figure 1:
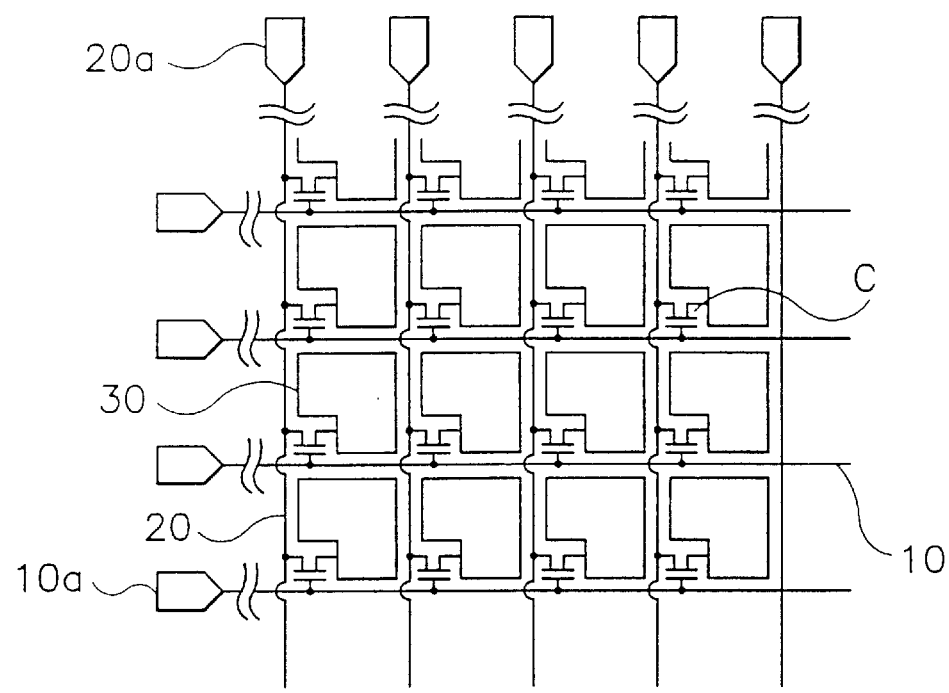
FIG. 1 is a circuit diagram of the lower panel of a conventional liquid crystal display device.
Figure 2:
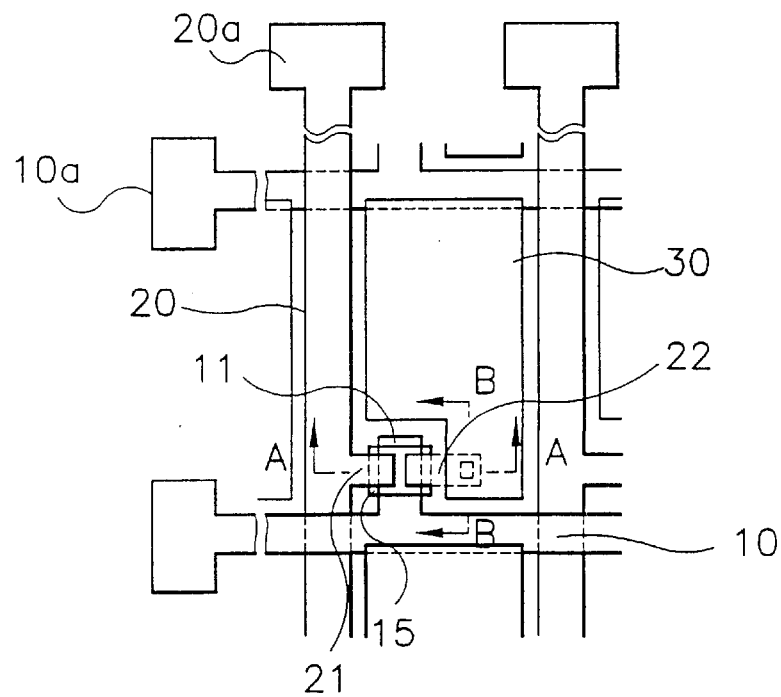
FIG. 2 is a plan view showing the lower panel of the conventional liquid crystal display device.
Figure 3A:
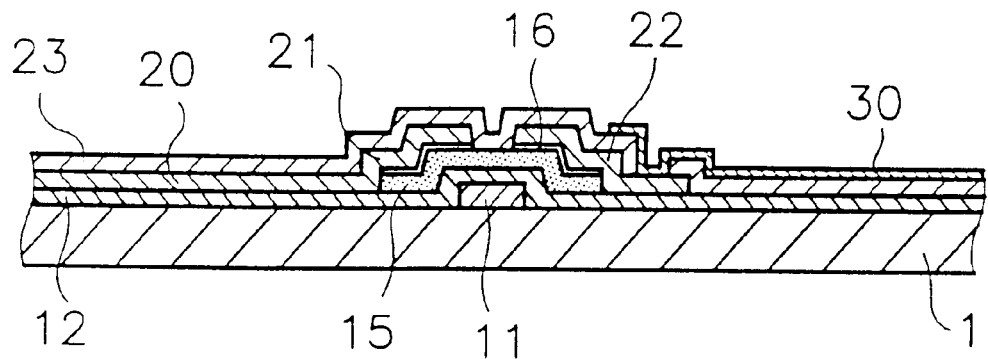
FIG. 3a is a cross-sectional view along the line A—A of the FIG. 2.
Figure 3B:
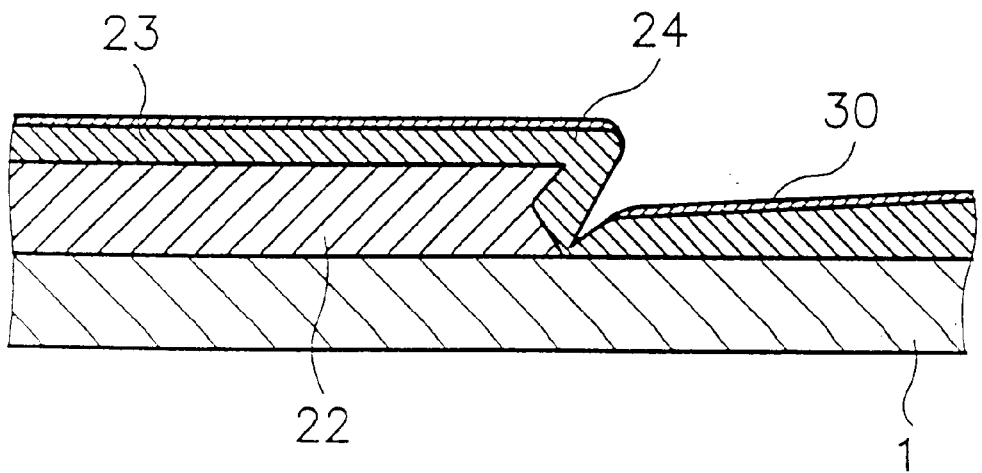
FIG. 3b is a cross-sectional view along the line B—B of the FIG. 2.
Figure 7:
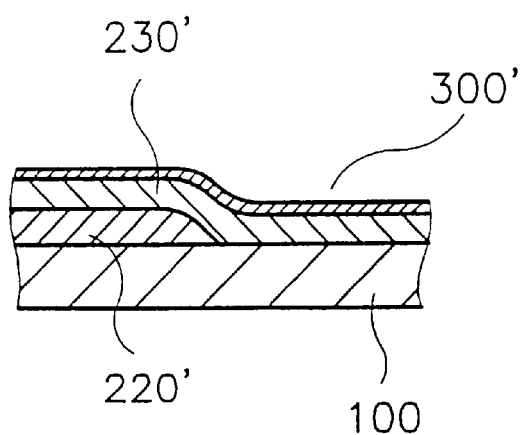
Figure 8A:
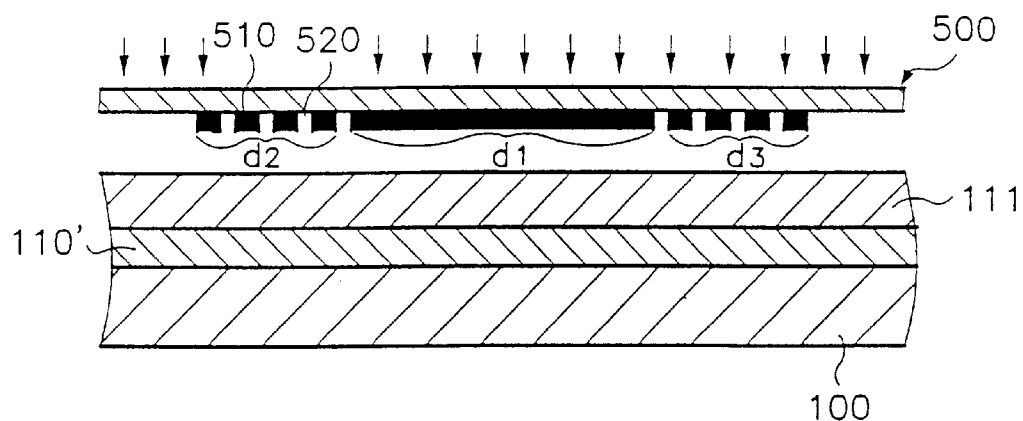
Figure 8B:
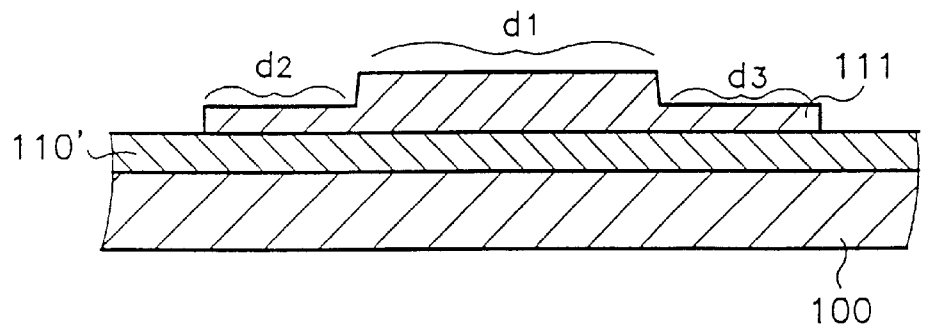
Figure 8C:
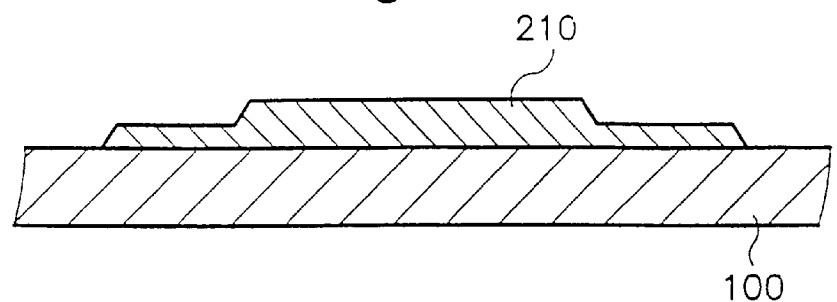

FIG. 7 is a cross-sectional view along the line B—B of the FIG. 2 according to a preferred embodiment of the present invention; and FIGS. 8a–8c show cross-sectional views for explaining an exposing process for the photo-resist by using a mask which includes lines and spaces and an etching process for the metal layer by using the photo-resist according to a preferred embodiment of the present invention.

DETAILED DESCRIPTION OF PREFERRED EMBODIMENTS

Referring to the Figures, embodiments of the present invention will be explained in detail. FIGS. 6a–6i are cross-sectional views which show a method of manufacturing an LCD panel according to a preferred embodiment of the present invention.

Figure 4:
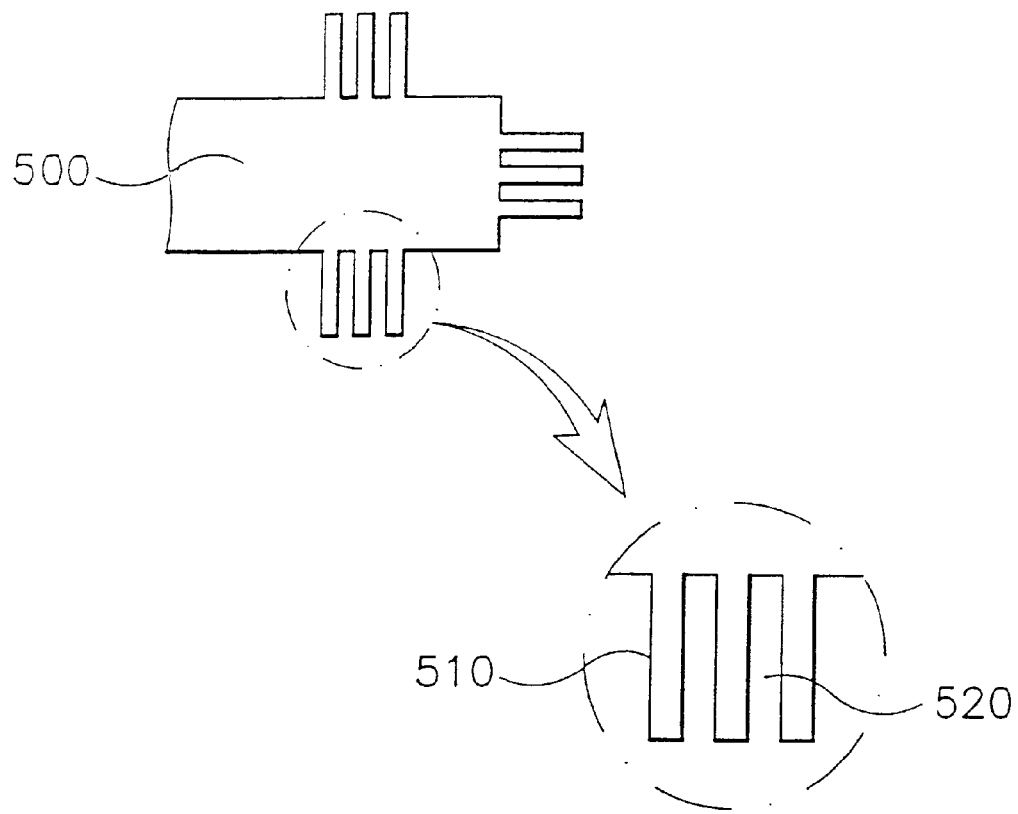
FIG. 4 shows a mask pattern including lines and spaces according to a preferred embodiment of the present invention.
Figure 5:
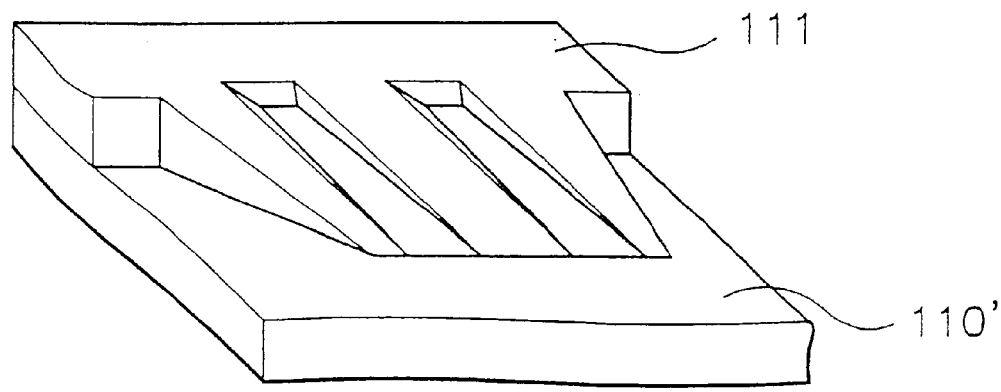
FIG. 5 shows a patterned photo-resist on a metal layer using the mask which include lines and spaces according to a preferred embodiment of the present invention.
Figure 6A:
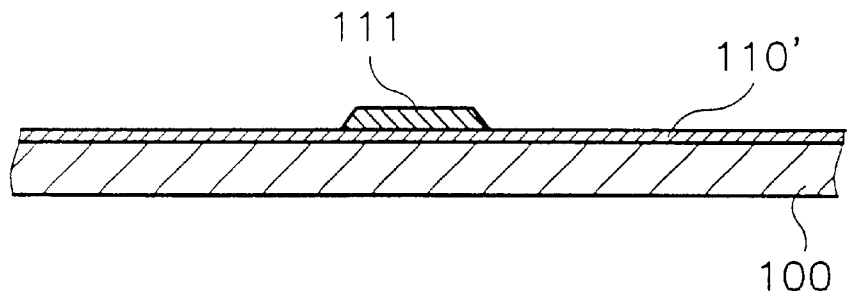
FIGS. 6a–6i show cross-sectional views for illustrating a process of forming a liquid crystal display device according to a preferred embodiment of the present invention.

On a transparent substrate 100, aluminum or aluminum alloy are applied to form a first metal layer 110' as shown in FIG. 6a. A photo-resist is coated on the first metal layer 110'. The photo-resist is patterned by using a novel mask 500, as shown in FIG. 4. More particularly, the mask includes lines separated by spaces and the lines are arranged such that a distance between adjacent lines is smaller than a resolution of an exposure system used with the mask in the step of exposing the photo-resist. The lines and spaces of the mask are preferably located at the edge portions of the pattern of the mask. Generally, the exposure system has the resolution of 3–4 $\mu$m(FX-510D : Nikon of Japan 2.4 $\mu$m(independent), 3 $\mu$m(L/S)). Therefore, the mask preferably has a comb pattern of lines and spaces in which a plurality of lines 510 having a width of about 1 $\mu$m and a plurality of spaces 520 having a width of about 0.5 $\mu$m is formed therebetween.

Figure 6B:
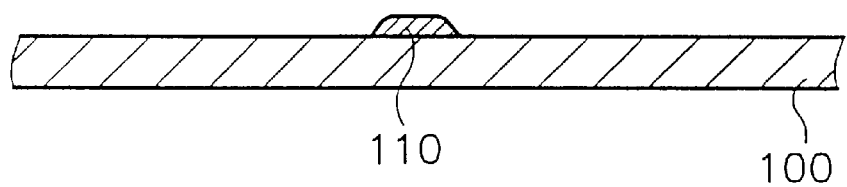

The first metal layer 110' is patterned according to the photo-resist pattern disposed thereon to form a plurality of gate lines, a gate pad and a gate electrode 110 derived from the gate bus line as shown in FIG. 6b. After the first metal layer 110' is etched, the remaining photo-resist thereon is removed.

Figure 6C:
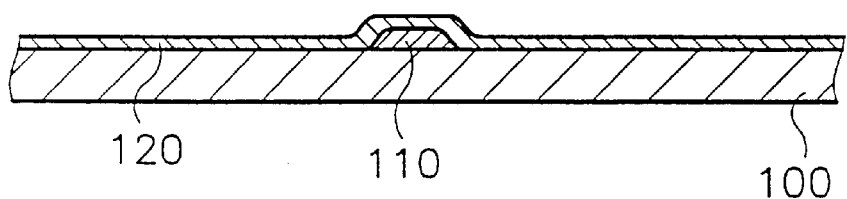

A gate insulating layer 120 is deposited on the substrate 100 including the gate electrode 110 using an insulating material having a high insulating property and a good adhesive property such as $SiN_x$ or $SiO_x$, as shown in FIG. 6c.

Figure 6D:
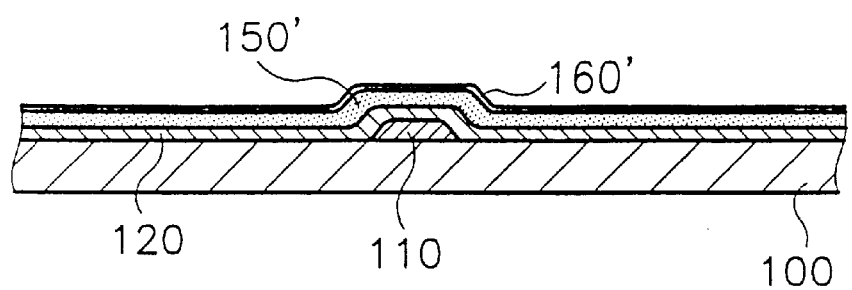

An amorphous silicon 150' and an n$^+$ type impurity doped amorphous silicon 160' are sequentially deposited on the gate insulating layer 120 as shown in FIG. 6d.

Figure 6E:
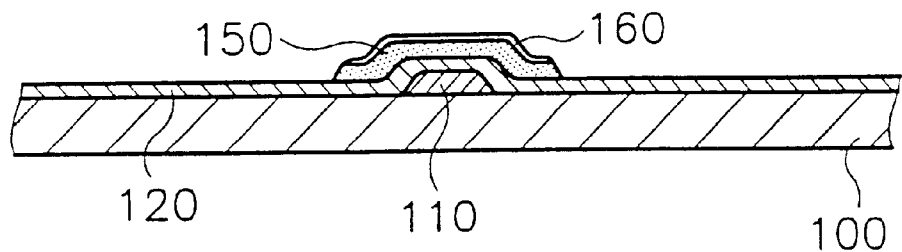

The amorphous silicon 150' and the n$^+$ impurity doped amorphous silicon 160' layers are patterned to form an intrinsic semiconductor layer 150 and a doped semiconductor layer (or ohmic contact layer) 160 as shown in FIG. 6e.

Figure 6F:
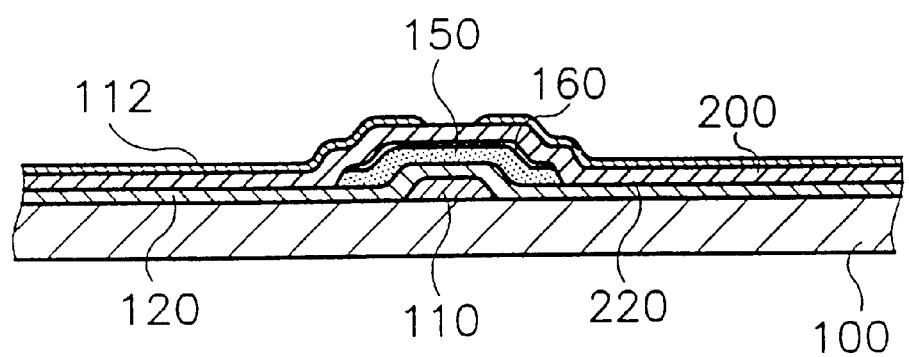

A second metal layer 200 is deposited on the resultant surface including the doped semiconductor layer 160. A second photo-resist 112 is deposited on the second metal layer 200. The photo-resist is also patterned using a mask which has lines and spaces, wherein a distance between adjacent lines is less than the resolution of the exposure system used for exposing the photo-resist. The lines and spaces of the mask are preferably located at the edge portions of the pattern of the mask. The mask, as mentioned above, preferably has lines and spaces arranged to define a comb pattern, in which a plurality of lines 510 have a width of about 1 $\mu$m and a space 520 having a width of about 0.5 $\mu$m as shown in FIG. 4. Such a novel mask 500 is used for developing and exposing the second photo-resist 112 as shown in FIG. 6f.

Figure 6G:
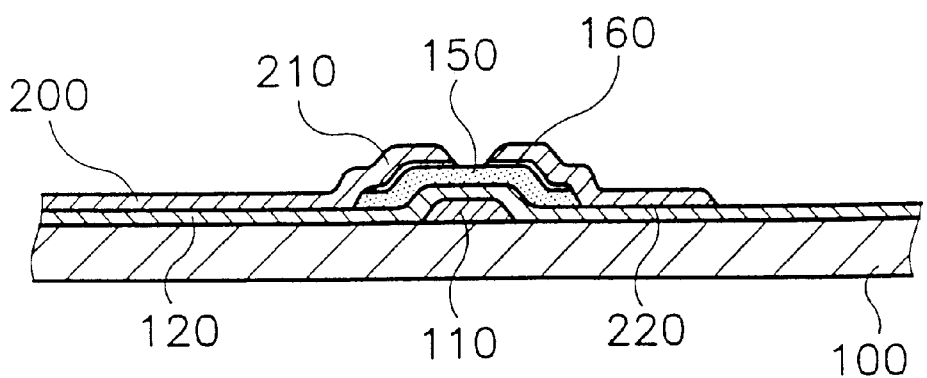

The second metal layer 200 is patterned according to the photo-resist 112 patterned thereon to form a plurality of data bus lines, a data pad and a source electrode 210 derived from the gate bus line and a drain electrode 220 which faces the source electrode 210 as shown in FIG. 6g.

Figure 6H:
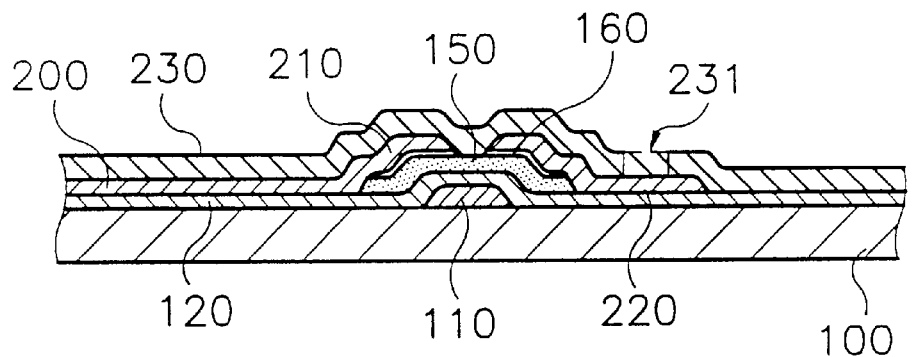

A passivation layer 230 which covers the substrate 100 including the source electrode 210 and the drain electrode 220 as shown in FIG. 6h.

Figure 6I:
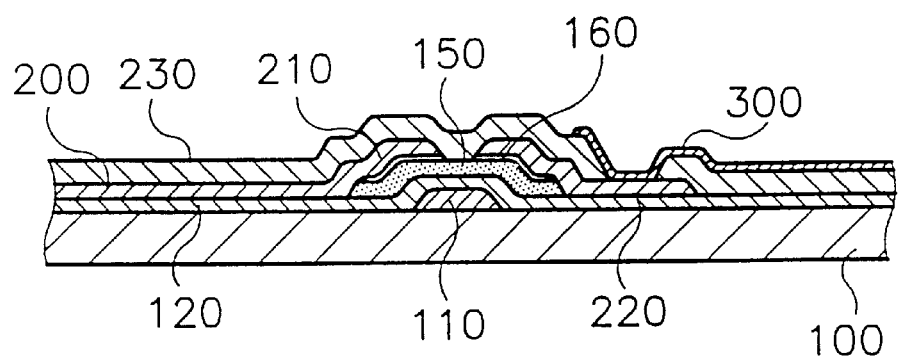

A contact hole 231 is formed by patterning the passivation layer 230 to expose some portions of the drain electrode 220. An ITO(Indium Tin Oxide) is deposited on the patterned passivation layer 230. The ITO layer is patterned to form a pixel electrode 300 contacting the drain electrode 220 through the contact hole 231 as shown in FIG. 6i.

According to preferred embodiments of the present invention, when a step of exposing is performed, the amount of the UV(Ultra Violet) light is controlled by using the mask 500 which has line and space patterns in which a width of the lines 510 is about 1 $\mu$m and a width of the spaces 520 is about 0.5 $\mu$m as shown in FIG. 8a. Therefore, the thickness of the patterned photo-resist can be controlled. The d1 portion of the mask 500 blocks the UV light so that the photo-resist fully remains. The d2 and d3 portions of the mask 500 pass some amount of the UV light through the space having a width of about 0.5 $\mu$m, so that some amount (thickness) of the photo-resist remains as shown in FIG. 8b. After the first metal layer 110' is patterned first by using the patterned photo-resist 111 as shown in FIG. 8b, the patterned metal layer 210 is formed as shown in FIG. 8c.

The preferred embodiments of the present invention provide a method of manufacturing an LCD including at least two stacked thin film layers in which the upper thin film smoothly and completely covers the lower thin film. According to preferred embodiments of the present invention, a mask for patterning the photo-resist which covers the lower thin layer has lines and spaces arranged such that a distance between adjacent lines is less than a resolution of the exposure system used with the mask for exposing the photo-resist. As a result, the photo-resist is thinner at a location of the line and space pattern. According to preferred embodiments of the present invention, a photo-resist having at least two different thickness portions is formed in a single patterning step as shown in FIGS. 8a–8c. When the lower thin layer is etched with the patterned photo-resist, the cross-sectional shape of the lower thin layer has a smoothly tapered shape with a smooth inclined contour instead of steep sloped shape and without a shoulder. Therefore, the upper thin layer deposited on the lower thin layer smoothly covers the lower thin layer with uniform thickness as shown in FIG. 7. As a result, the upper thin layer does not have any cracks or discontinued portions. Furthermore, the lower thin layer can be perfectly covered by the upper thin layer so as not to be damaged by any etchant used for forming any thin layer deposited thereon later.

The invention being described above, it should be apparent that this invention may be varied in many ways. Such variations are not to be regarded as a departure from the spirit and scope of the invention, and all such modifications obvious to one in the skilled art are intended to be included within the scope of the following claims.

What is claimed is:

1. A method of manufacturing a semiconductor device comprising the steps of:

providing a substrate;

forming a first metal layer on the substrate;

forming a photo-resist on the first metal layer; and exposing and developing the photo-resist using an exposure system and only a single mask having lines and spaces, a width of each line being about 1 $\mu$m, such that the photo-resist has a pattern including a thick portion and a thin portion, the pattern being a comb shape.

2. The method according to claim 1, wherein a width of the space of the mask is about 0.5 $\mu$m.

3. The method according to claim 1, wherein the exposing and developing of the photo-resist is done by performing a single masking step.

4. The method according to claim 1, wherein the exposure system's resolution is about 3–4 $\mu$m.

5. A method of manufacturing a semiconductor device comprising the steps of:

providing a substrate;

forming a layer on the subsrate;

forming a photo-resist on the layer; and performing a single masking step using an exposure system and a mask having lines and spaces, a width of each line being about 1 $\mu$m, the masking step being used to develop the photo-resist such that the photo-resist has a thick portion and a thin portion, the photo-resist being a comb shape.

6. The method according to claim 5, wherein a width of the space of the mask is about 0.5 $\mu$m.

7. The method according to claim 5, wherein the layer is an insulating layer.

8. The method according to claim 5, wherein the layer is a metal layer.

9. The method according to claim 5, wherein the exposure system's resolution is about 3–4 $\mu$m.

10. A method of manufacturing a liquid crystal display comprising the steps of:

providing a substrate;

forming a layer on the substrate;

forming a photo-resist on the layer; and exposing and developing the photo-resist using an exposure system and only a mask having lines and spaces, a width of each line being about 1 $\mu$m, such that the photo-resist has a pattern including a thick portion and a thin portion, the pattern being a comb shape.

11. The method according to claim 10, wherein a width of the space of the mask is about 0.5 $\mu$m.

12. The method according to claim 10, wherein the layer is an insulating layer.

13. The method according to claim 10, wherein the layer is a metal layer.

14. The method according to claim 10, wherein the exposing and developing of the photo-resist is done by performing a single masking step.

15. The method according to claim 10, wherein the exposure system's resolution is about 3–4 $\mu$m.

16. A method of manufacturing a liquid crystal display comprising the steps of:

providing a substrate;

forming a layer on the substrate;

forming a photo-resist on the layer; and performing a single masking step using an exposure system and a mask having lines and spaces, a width of each line being about 1 $\mu$m, to develop the photo-resist such that the photo-resist has a thick portion and a thin portion, the photo-resist being a comb shape.

17. The method according to claim 16, wherein a width of the space of the mask is about 0.5 $\mu$m.

18. The method according to claim 16, wherein the layer is an insulating layer.

19. The method according to claim 16, wherein the layer is a metal layer.

20. The method according to claim 16, wherein the exposure system's resolution is about 3–4 $\mu$m.

* * * * *